United States Patent [19]

Baker

[11] Patent Number: 4,887,762
[45] Date of Patent: Dec. 19, 1989

[54] SOLDER COATING PROCESSES

[75] Inventor: William H. Baker, Filton, United Kingdom

[73] Assignee: British Aerospace Public Limted Company, London, United Kingdom

[21] Appl. No.: 162,201

[22] Filed: Feb. 29, 1988

[30] Foreign Application Priority Data

Mar. 12, 1987 [GB] United Kingdom ............... 8705913

[51] Int. Cl.$^4$ .............................................. H05K 3/34
[52] U.S. Cl. .................................. 228/260; 427/96; 118/423; 118/428; 118/429; 118/500; 228/180.2
[58] Field of Search .............. 228/37, 180.2, 260; 118/428, 429, 423, 500; 427/96

[56] References Cited

U.S. PATENT DOCUMENTS

| | | | |
|---|---|---|---|
| 4,119,211 | 10/1978 | Boyer et al. | 198/403 X |
| 4,285,457 | 8/1981 | Kondo | 228/43 |
| 4,558,812 | 12/1985 | Bailey et al. | 228/47 |
| 4,570,569 | 2/1986 | Kondo | 118/500 X |
| 4,606,788 | 8/1986 | Moran | 427/96 X |
| 4,720,034 | 1/1988 | Lee | 228/37 |
| 4,766,842 | 8/1988 | Long et al. | 118/423 X |

FOREIGN PATENT DOCUMENTS 0150954 1/1985 European Pat. Off. .
2174326A 11/1986 United Kingdom .

Primary Examiner—Kenneth J. Ramsey
Attorney, Agent, or Firm—Nixon & Vanderhye

[57] ABSTRACT

Apparatus and method for foam fluxing and tinning the solder pads of a plurality of leadless ceramic chip packages wherein each package is held by suction on a carrier surface such that the pads are exposed to solder as the carrier is passed over a jet of solder. The devices are oriented on the carrier such that the leading edge of the devices is inclined at an angle to the direction of conveying. The conveying system includes an endless chain for passing the carrier in an endless loop through the various stations of loading, fluxing, tinning, cleaning and unloading.

11 Claims, 3 Drawing Sheets

SOLVENT PUMPED UPWARDS

SOLDER COATING PROCESSES

This invention relates to solder coating processes and is more concerned with such processes applied to leadless ceramic chip carriers.

Leadless ceramic chip carriers (LCCCs) are used for packaging semiconductor devices and are mounted on the surface of a printed circuit board (PCB) without the need for 'through' holes. The LCCC is a rectangular ceramic package of a given size, the size being dependent on the number of interconnections required between the PCB and the semiconductor device mounted in a recess formed in the package. Wires are bonded between the device and internal pads of the LCCC to form internal interconnections, the external interconnections being formed between solder pads provided around the periphery of the package and the PCB. The solder pads are metallic and are equally spaced around the base of the package. Electrical and mechanical interconnection between the LCCC and the PCB is achieved by soldering the LCCC onto a pattern of pads on the board.

The LCCC solder pads are fabricated with a tungsten underlay coated by a layer of nickel to give solderability and a layer of gold 3 m thick to give environmental protection. However, the presence of gold and the use of a high percentage tin bearing solder can result in solder joint embrittlement due to the formation of brittle gold-tin intermetallics at the joint interface. These intermetallics can form either immediately as the tin combines with the interface gold or, at a later time due to the diffusion and growth of the tin and gold at a gold free interface provided there is sufficient gold in solution in the bulk solder. Therefore, in order to ensure subsequent joint reliability, particularly where there is the possibility of thermal expansion mismatch between the LCCC and PCB, it is necessary to remove the gold layer from the pad interface prior to soldering.

A standard method of degolding electronic components is to use the gold scavenging action of tin/lead solder. This process effectively degolds and leaves a coating of tin/lead solder on the pad surface which is readily solderable. However, as brittle intermetallics of gold can form at a gold free interface given a sufficient bulk solder gold contamination, it is important to carefully monitor the gold contamination in the solder bath. In many cases, two solder baths are used to alleviate this problem, that is, a 'degolding bath' and a 'tinning bath', the solder from each bath being continually monitored for gold contamination.

According to one aspect of the invention, there is provided apparatus for producing a solderable surface on solder pads of a plurality of leadless ceramic chip packages each containing a semiconductor device, the apparatus comprising:

a loading means for loading the packages onto a movable carrier;

a flux foaming means for removing a protective layer from the solder pads of each package;

a solder coating means for solder coating the solder pads of each package;

a cleaning means for removing excess flux from each package; and an unloading means for unloading the packages from the carrier.

However, solder flow around the packages is not sufficient to provide a complete coating of solder on the solder pads of the packages.

According to a second aspect of the invention, there is provided a method of improving solder flow around a generally rectangular leadless ceramic chip package containing a semiconductor device during a solder coating process, the method comprising loading the package onto a carrying surface of a carrier such that a straight edge of the package in a plane parallel to said surface is inclined to the direction of relative motion between the carrier and the solder to improve said flow.

Preferably, the straight edge of the package is substantially inclined at an angle in the range of 40° to 50°.

Advantageously, the angle is substantially 45°.

For a better understanding of the invention, reference will now be made, by way of example, to the accompanying drawings in which.

Figure 1:
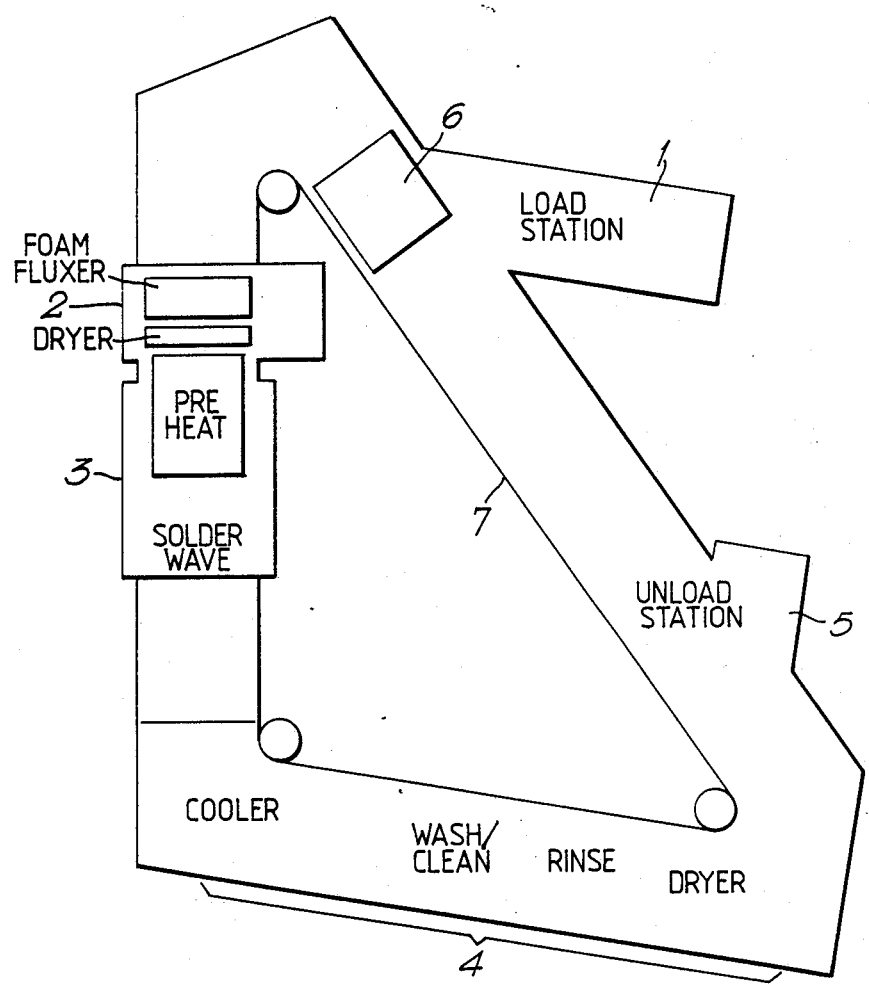
FIG. 1 is a schematic diagram of a solder coating apparatus.
Figure 5A:
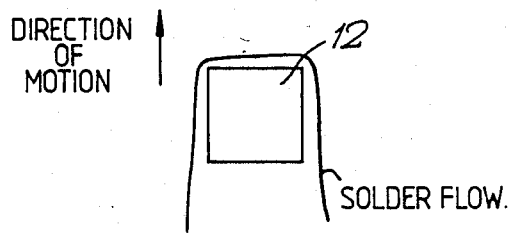
Figure 5B:
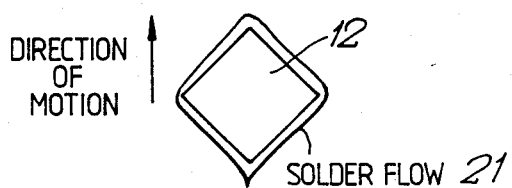
Figure 6:
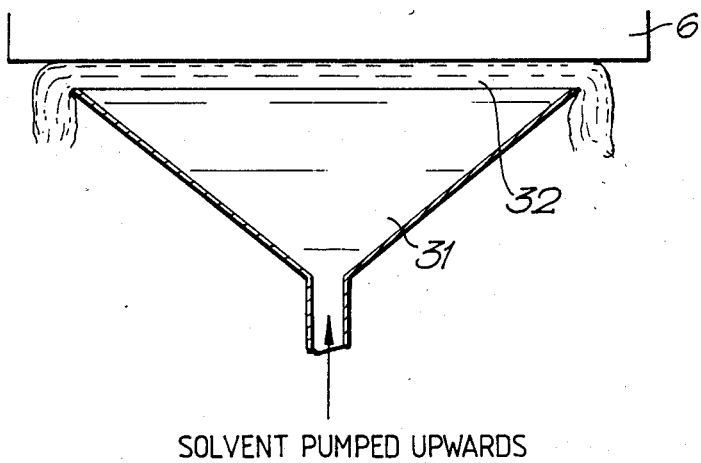

FIGS. 5(a) and 5(b) show the solder flow around a LCCC when it is straight on and angled to the direction of motion of the pallet; and FIG. 6 is a schematic diagram of a weir used in the cleaning station of the FIG. 1 apparatus.

FIG. 1 is a diagram of solder coating apparatus. The apparatus is generally arranged in a loop and consists of a loading station 1, a flux foaming station 2, a soldering station 3, a cleaning station 4, and an unloading station 5. At the loading station 1 (shown in more detail in FIG. 2), the leadless ceramic chip carriers (LCCCs) to be solder coated are loaded onto a pallet 6 from plastic carrying sticks. The pallet 6 then moves around the loop travelling at predetermined rates over each station in turn for the amount of time required to carry out the function of the respective station. The flux foaming station 2 carries out the process of activating the solder pads of the LCCCs and then dries them prior to next process, in this case, preheating at the soldering station 3, prior to the solder coating being applied. The solder coating is applied using a Kirsten solder jet wave machine ie the solder is applied to the LCCCs by passing the pallet 6 over a jet of solder. The jet of solder removes the gold from the solder pads of the LCCCs, since gold is very soluble in the solder, and leaves a solder coating on the pads. This coating is then cooled and any excess flux is removed and the LCCCs are dried at the cleaning station 4. The LCCCs are then reloaded into plastic carrying sticks at the unloading station 5. The pallet 6 is moved around the loop in guideways and is driven by a chain drive 7 passing round the inner perimeter of the loop.

Figure 2:
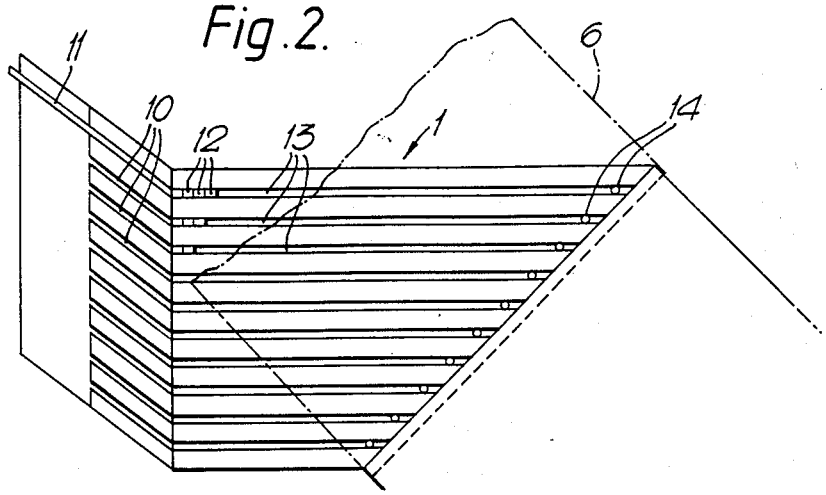
FIG. 2 is a schematic diagram of the loading station of the FIG. 1 apparatus.
Figure 3:
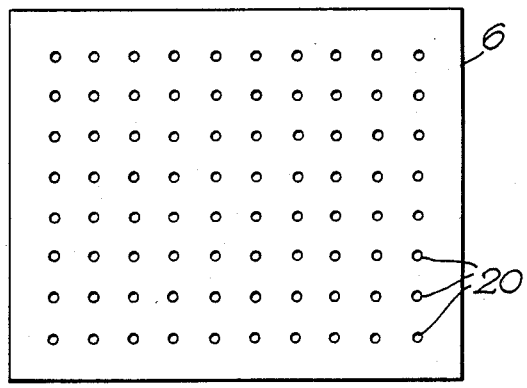
FIG. 3 is a schematic diagram of the underside of a pallet.

The loading station as shown in FIG. 2 comprises ten guide channels 10 in which the plastic carrying sticks 11 (only one shown), containing the LCCCs 12, are placed. These channels 10 are adjustably inclined at an angle between 50° to 60° to the horizontal. The sticks are vibrated by means not shown, to allow the LCCCs to be vibrated out of their respective sticks one at a time into channels 13 until they are aligned over vacuum collets 14 ie one LCCC in each channel 13 is aligned with one collet 14. The ten collets 14 are then operated to raise the ten LCCCs to a position where they can be retained by the pallet 6, the pallet having a vacuum system for holding a plurality of rows of ten LCCCs onto its undersurface. Naturally the pallet 6 has a plurality of holes 20 (see FIG. 3) through which the vacuum can be applied to the LCCCs, the number of holes 20 and their spacing being related to the size of LCCC to be solder coated. In this example, the pallet 6 has a matrix holes 20 ten by eight ie eighty LCCCs can be coated at one time. The collets 13 therefore operate eight times ie once for each row, to fill the pallet 6, each row of LCCCs being retained by the pallet vacuum system as required.

Figure 4:
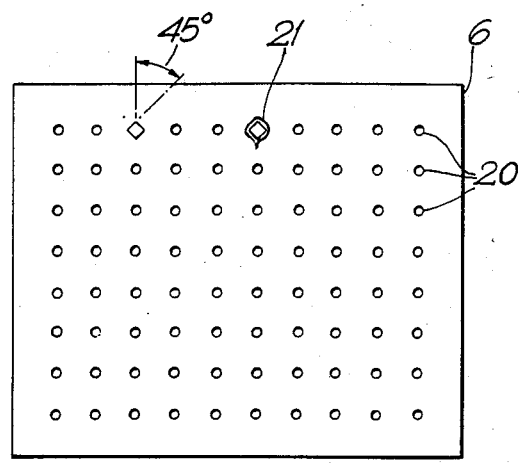
FIG. 4 is a diagram of the FIG. 3 pallet with leadless ceramic chip carriers (LCCCs) angled at 45° to the leading edge of thr pallet.

Once loaded onto the pallet 6, each LCCC is presented to the flux foaming station at an angle of 45° thus permitting improved flux coverage of the solder pads. Likewise, each LCCC is presented to the solder wave machine at an angle of 45° thereby allowing each solder pad to be properly coated ie the flow of solder 21 is improved around each LCCC (see FIGS. 4 and 5). In FIG. 5(a), the LCCC is placed straight on to the direction of motion of the pallet and the back end of the LCCC is not coated. Whereas in FIG. 5(b), the LCCC is angled to the direction of motion and the solder flow is improved to coat all the sides of the LCCC.

The unloading station 5 (not shown in detail) operates in reverse to the loading station 1, the LCCCs being released row by row as the vacuum holding them onto the pallet 6 is removed. The released LCCCs are then vibrated down further guide channels (similar to channels 10) into the empty plastic carrying sticks 11. The cleaning station 4 includes a cooler 30 which cools the LCCCs prior to their washing to remove excess flux—this helps to prevent thermal shock. The pallet 6 passes from the cooler 30 to a washer 31 which is in the form of a pair of weirs 32, only one of which is shown in FIG. 5. Each weir 32 spreads the cleaning solvent over the entire undersurface of the pallet 6 to remove the excess flux, one being positioned behind the other to provide effective cleaning. After washing, the LCCCs are rinsed to remove any traces of solvent and are then dried prior to being unloaded as described above.

Naturally, the apparatus can accommodate more than one pallet, and in one specific arrangement, three pallets are utilised simultaneously, the pallets being spaced apart so that the timing for the respective stations are satisfied. For example, one pallet may be at the loading station 1, another one at the unloading station 5, and a third at the cooler 30.

As mentioned previously, the number of LCCCs coated at any one time is dependent on the size of the LCCC ie the smaller the LCCC, the larger the number of devices which can be accommodated by the pallet. Naturally, different pallets would be required for different sizes and hence numbers of LCCCs. In practice only, two sizes of pallet may be used ie one for LCCCs having up to and including forty-four pads; and one for forty-five to eighty-four pad LCCCs.

I claim:

1. Apparatus for producing a solderable surface on solder pads of a plurality of leadless ceramic chip packages each containing a semiconductor device, the apparatus comprising:
   a loading means for loading the packages onto a movable carrier;
   a flux foaming means for activating the solder pads of each package;
   a solder coating means for solder coating the solder pads of each package;
   a cleaning means for removing excess flux from each package; and
   an unloading means for unloading the packages from the carrier wherein the loading means, flux foaming means, solder coating means, cleaning means and unloading means are arranged in a loop configuration, wherein each package is generally rectangular in shape and is loaded onto a carrying surface of the movable carrier so that a straight edge of the package in a plane parallel to said surface is inclined to the direction of motion of the carrier.

2. Apparatus according to claim 1, wherein the straight of edge the package is inclined substantially at 45°.

3. Apparatus according to claim 1, wherein the movable carrier is moved from station to station by means of a chain drive connecting all the stations in a loop.

4. Apparatus according to one of claims 1, 2 or 3, wherein the movable carrier retains the packages on its underside by vacuum means.

5. Apparatus according to one of claims 1, 2 or 3, wherein the flux foaming station includes a dryer.

6. Apparatus according to one of claims 1, 2 or 3, wherein the solder coating station includes a preheating section and a soldering section.

7. Apparatus according to claim 6, wherein the soldering section is a solder jet wave.

8. Apparatus according to one of claims 1, 2 or 3, wherein the cleaning station includes a cooling section, a washing section and a drying section.

9. A method of improving solder flow around a generally rectangular leadless ceramic chip package containing a semiconductor device during a solder coating process, the method comprising the step of loading the package onto carrying surface of a carrier such that a straight edge of the package in a plane parallel to said surface is inclined to the direction of relative motion between the carrier and the solder to improve said flow.

10. A method according to claim 9, wherein the straight edge of the package is substantially inclined at an angle in the range of 40° to 50°.

11. A method according to claim 10, wherein the angle is substantially 45°.

* * * * *